US009240786B2

(12) United States Patent
Tanimura et al.

(10) Patent No.: US 9,240,786 B2
(45) Date of Patent: *Jan. 19, 2016

(54) HOMOGENEOUS DUAL-RAIL LOGIC FOR DPA ATTACK RESISTIVE SECURE CIRCUIT DESIGN

(71) Applicants: Kazuyuki Tanimura, Irvine, CA (US); Nikil Dutt, Irvine, CA (US)

(72) Inventors: Kazuyuki Tanimura, Irvine, CA (US); Nikil Dutt, Irvine, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 199 days.

This patent is subject to a terminal disclaimer.

(21) Appl. No.: 13/794,775

(22) Filed: Mar. 11, 2013

(65) Prior Publication Data

US 2013/0293259 A1 Nov. 7, 2013

Related U.S. Application Data

(63) Continuation of application No. 13/286,136, filed on Oct. 31, 2011, now Pat. No. 8,395,408.

(60) Provisional application No. 61/408,476, filed on Oct. 29, 2010.

(51) Int. Cl.
*H03K 19/00* (2006.01)
*H03K 19/003* (2006.01)
*H03K 19/096* (2006.01)

(52) U.S. Cl.
CPC ........ *H03K 19/003* (2013.01); *H03K 19/00392* (2013.01); *H03K 19/096* (2013.01)

(58) Field of Classification Search
None
See application file for complete search history.

(56) References Cited

U.S. PATENT DOCUMENTS

| 6,781,420 | B2 * | 8/2004 | Zhang | 326/115 |
| 7,519,643 | B2 * | 4/2009 | Har et al. | 708/491 |
| 8,395,408 | B2 * | 3/2013 | Tanimura et al. | 326/8 |
| 2006/0261858 | A1 | 11/2006 | Manfred | |
| 2008/0224727 | A1 | 9/2008 | Verbauwhede et al. | |

OTHER PUBLICATIONS

Akkar, ML, et al., "An Implementation of DES and AES, Secure against Some Attacks", Proc. CHES 2001, LNCS 2162, pp. 309-318.
Ambrose, J.A., et al., RIJID: Random Code Injection to Mask Power Analysis based Side Channel Attacks, Proc. DAC, Jun. 2007, pp. 489-492.
Coron, JS, et al., "On Boolean and Arithmetic Masking against Differential Power Analysis", Proc. CHES 2000, LCNS 1965, pp. 231-237.
Gebotys, C., "A Table Masking Countermeasure for Low-Energy Secure Embedded Systems", IEEE Trans. VLSI Systems, vol. 14, No. 7, Jul. 2006, pp. 740-753.
Golic, J. D., et al., "Multiplicative Masking and Power Analysis of AES", Proc. CHES 2002, LNCS 2523, pp. 198-212.

(Continued)

*Primary Examiner* — Anh Tran
(74) *Attorney, Agent, or Firm* — One LLP

(57) ABSTRACT

Homogenous dual-rail logic for DPA attack resistive secure circuit design is disclosed. According to one embodiment, an HDRL circuit comprises a primary cell and a complementary cell, wherein the complementary cell is an identical duplicate of the primary cell. The HURL circuit comprises a first set of inputs and a second set of inputs, wherein the second set of inputs are a negation of the first set of inputs. The HURL circuit has a differential power at a level that is resistive to DPA attacks.

21 Claims, 14 Drawing Sheets

(56) References Cited

OTHER PUBLICATIONS

Guilley, S., et al., "CMOS Structures Suitable for Secured Hardware", Proc. DATE, 2004, pp. 1414-1415.

Khatir, M., et al., "A Secure and Low-Energy Logic Style Using Charge Recovery Approach", Proc. ISLPED, Aug. 2008, pp. 259-264.

Popp, T., et al., "Masked Dual-Rail Pre-charge Logic: DPA-Resistance Without Routing Constraints", Proc. CHES 2005, LNCS 3659, pp. 172-186.

Schaumont, P., et al., "Masking and Dual-Rail Logic Don't Add Up", Proc. CHES 2007, LNCS 4727, pp. 95-106.

Tanimura, K., et al., "HDRL: Homogeneous Dual-Rail Logic for DPA Attack Resistive Secure Circuit Design", pp. 1-7.

Tiri, K., et al., "A Dynamic and Differential CMOS Logic with Signal Independent Power Consumption to Withstand Differential Power Analysis on Smart Cards", Proc. ESSCIRC, Sep. 2002, pp. 403-406.

Tiri, K., et al., "Securing Encryption Algorithms against DPA at the Logic Level: Next Generation Smart Card Technology", Proc. CHES 2005, LNCS 2779, pp. 125-136.

Tiri, K., et al., "Charge Recycling Sense Amplifier Based Logic: Securing Low Power Security IC's against DPA", IEEE 2004, pp. 179-182.

Tiri, K., et al., "A Logic Level Design Methodology for a Secure DPA Resistant ASIC or FPGA Implementation", Proc. DATE, 2004, pp. 1-6.

Tiri, K., et al., "A VLSI Design Flow for Secure Side-Channel Attack Resistant ICs", Proc. DATE, Mar. 2005, pp. 1-6.

Tiri, K., et al., "Prototype IC with WDDL and Differential Routing—DPA Resistance Assessment", Proc. CHES 2005, LNCS 3659, pp. 354-365.

Tiri, K., et al., "A Side-Channel Leakage Free Coprocessor IC in 0.18µm CMOS for Embedded AES-based Cryptographic and Biometric Processing", Proc. DAC, Jun. 2005, pp. 222-227.

Tiri, K., et al., "Design Method for Constant Power Consumption of Differential Logic Circuits", Proc. DATE, 2005, pp. 628-633.

Tiri, K., et al., "A Digital Design Flow for Secure Integrated Circuits", IEEE Trans. Computer-Aided Design Integrated Circuits and Systems, vol. 25, No. 7, Jul. 2006, pp. 1197-1208.

Verbauwhede, I., et al., "Circuits and design techniques for secure ICs resistant to side-channel attacks", Proc. ICICDT, IEEE 2006, pp. 1-4.

\* cited by examiner

HOMOGENEOUS DUAL-RAIL LOGIC FOR DPA ATTACK RESISTIVE SECURE CIRCUIT DESIGN

The present application claims the benefit of and priority to U.S. Provisional Application No. 61/408,476 titled "HOMOGENEOUS DUAL-RAIL LOGIC FOR DPA ATTACK RESISTIVE SECURE CIRCUIT DESIGN," filed on Oct. 29, 2010, which is hereby incorporated by reference in its entirety.

FIELD

The present disclosure relates generally to the design of secure circuits and, more particularly, to systems and methods that facilitate the design of differential power analysis side-channel attack resistant secure circuits.

BACKGROUND

Differential power analysis (DPA) side-channel attacks pose serious threats for embedded system security and crypto-hardware systems. DPA attacks statistically find the correlation between power consumption and secret data in crypto-hardware.

A number of transistor through register-transfer level countermeasures have been proposed with varying DPA attack resistivity. DPA attack defense techniques include randomization techniques and masking countermeasures, sense amplifier based logic (SABL), and wave dynamic differential logic (WDDL).

Randomization techniques and masking countermeasures conceal intermediate variables and agitate power information. These countermeasures make it difficult to perform DPA but do not guarantee to obscure the power information. Randomization techniques and masking countermeasures also suffer from performance degradation.

Sense Amplifier Based Logic (SABL) and other transistor level countermeasures can minimize the power imbalance in a circuit. SABL is prohibitively expensive and time-consuming to design a full-custom chip every time.

Wave dynamic differential logic (WDDL), a dual-rail pre-charge logic standard cell countermeasure, guarantees a 100% switching factor by placing a complementary cell next to every original cell. For example, AND cells are paired with OR cells. Every WDDL cell is comprised of 2 standard cells and switches, including at least one of the primary and complementary cells. As a result, WDDL incurs over 2× area and energy overheads due to pairing the complementary cell with every cell in the original circuit. WDDL results in more than a 100% increase in energy consumption and WDDL fails in suppressing differential power. WDDL is still vulnerable to DPA attacks, and DPA attacks on WDDL still leak secret keys to adversaries.

SUMMARY

Homogenous dual-rail logic for DPA attack resistive secure circuit design is disclosed. According to one embodiment, an HDRL circuit comprises a primary cell and a complementary cell, wherein the complementary cell is an identical duplicate of the primary cell. The HDRL circuit comprises a first set of inputs and a second set of inputs, wherein the second set of inputs are a negation of the first set of inputs. The HDRL circuit has a differential power at a level that is resistive to DPA attacks.

The systems, methods, features and advantages of the invention will be or will become apparent to one with skill in the art upon examination of the following figures and detailed description. It is intended that all such additional methods, features and advantages be included within this description, be within the scope of the invention, and be protected by the accompanying claims. It is also intended that the invention is not limited to require the details of the example embodiments.

BRIEF DESCRIPTION

The accompanying drawings, which are included as part of the present specification, illustrate the presently preferred embodiment and, together with the general description given above and the detailed description of the preferred embodiment given below, serve to explain and teach the principles of the present invention.

Figure 1:
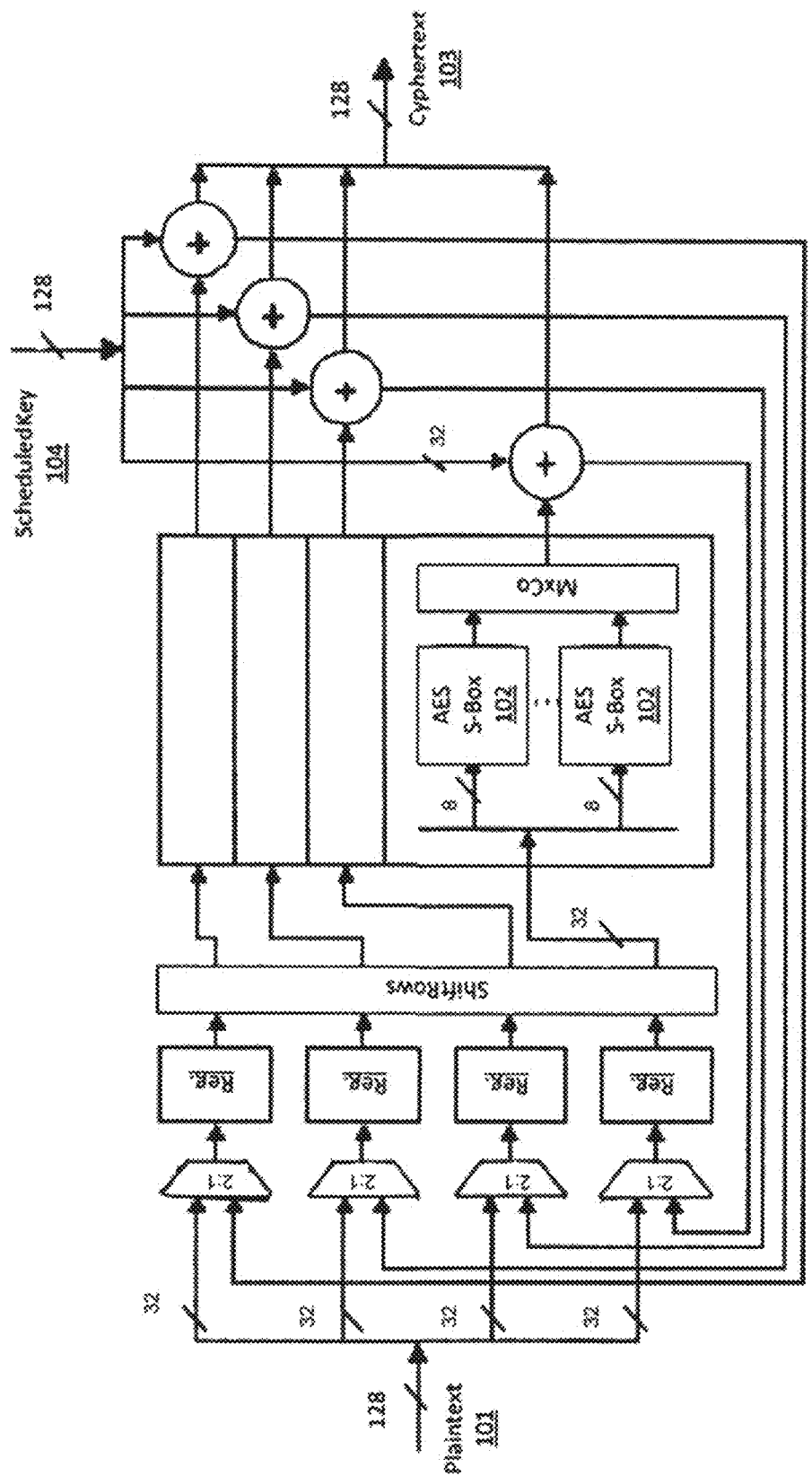
FIG. 1 illustrates an exemplary prior art AES data path.

It should be noted that the figures are not necessarily drawn to scale and that elements of similar structures or functions are generally represented by like reference numerals for illustrative purposes throughout the figures. It also should be noted that the figures are only intended to facilitate the description of the various embodiments described herein. The figures do not necessarily describe every aspect of the teachings disclosed herein and do not limit the scope of the claims.

DETAILED DESCRIPTION

Homogenous dual-rail logic for DPA attack resistive secure circuit design is disclosed. According to one embodiment, an HDRL circuit comprises a primary cell and a complementary cell, wherein the complementary cell is an identical duplicate of the primary cell. The HDRL circuit comprises a first set of inputs and a second set of inputs, wherein the second set of inputs are a negation of the first set of inputs. The HDRL circuit has a differential power at a level that is resistive to DPA attacks.

The embodiments described herein are directed to HDRL (Homogeneous Dual-Rail Logic). HDRL is a standard cell level DPA (Differential Power Analysis) attack countermeasure that guarantees fully balanced power consumption of standard cells and has been shown to significantly improve the DPA attack resistivity of hardware. HDRL provides higher DPA attack resistivity with much lower energy overhead (100.0% vs. 231.7% in the case of comparison to WDDL) and no delay overhead compared with conventional aforementioned standard cell countermeasures.

In contrast to WDDL, the present HDRL can be implemented using the same cells for both the primary and complementary cells. In the present HDRL technique, the original circuit can be duplicated and deployed next to the original circuit. The duplicated circuit then functions as complementary cells. The present HDRL method also duplicates the wire delay and capacitance to provide even better power balancing. Because HDRL is a standard cell level countermeasure, HDRL is the best approach for consumer security products (e.g., mobile devices), where design cost and time are critical.

The present HDRL technique judiciously combines VSS (supply) current waves and suppresses DP (Differential Power) curves, instead of providing a 100% switching factor that WDDL guarantees. Theoretically, HDRL enables forcing DP to be 0.

The present HDRL technique does not require a pre-charge step. As a result, there is no delay overhead. In contrast, WDDL may slow down the clock speed up to 2x in order to wait for the entire circuit to be pre-charged to 0. Furthermore, WDDL forbids the use of Inverter cells, and at times requires modification of the original circuit adding an additional delay penalty. On the contrary, HDRL does not require modification of the original circuit.

The present HDRL technique is applicable to any standard cell-based crypto-LSI that deals with personal information. Examples of applications of the present HDRL technique include smart cards, mobile devices, SIM cards, and health monitoring devices. The present HDRL technique enables high DPA attack resistivity in LSI designs for such applications.

It will be appreciated by one of ordinary skill in the art that, while the description herein uses an AES S-Box as an example for implementation and discussion, implementations using any applicable crypto-graphic hardware modules susceptible to DPA attacks are within the scope of the present disclosure. Examples of additional cryptographic hardware modules include those implementing algorithms such as Blowfish, DES, Triple DES, Serpent, Twofish, Camellia, CAST-128, IDEA, RC2, RC5, SEED, Skipjack, TEA, and XTEA.

FIG. 1 illustrates an exemplary AES data path. An AES S-Box 102 is an exemplar cryptographic module susceptible to DPA attacks. Plaintext 101 is a 128-bit vector of arbitrary plain bits. CipherText 103 is a 128-bit vector of cipher texts denoted as C. ScheduledKey 104 is a 128-bit vector of scheduled key K that consists of 16 8-bit secret Keys. A 128-bit AES uses 16 S-Boxes 102 that dominate the power consumption of an entire AES circuit (approximately 75%). As a result, adversaries are interested in collecting the power information of the S-Boxes. In order to evaluate the DPA attack resistivity of the AES data path, an individual AES S-Box must be evaluated.

It is noted that, while the AES S-Box is used as an exemplar cryptographic module in the present description, the present technique is applicable to other cryptographic hardware circuits without departing from the scope of the present disclosure.

Figure 2:
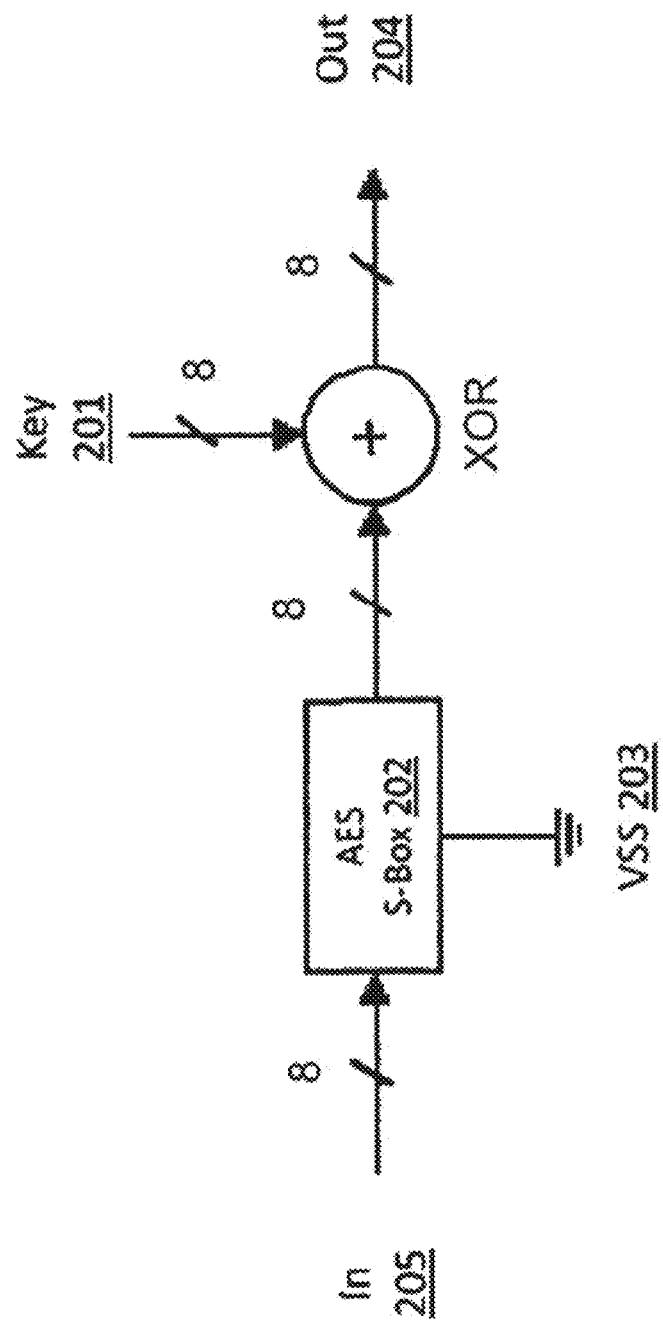
FIG. 2 illustrates an exemplary prior art model of DPA attacks on a single AES S-box.

FIG. 2 illustrates an exemplary model of DPA attacks on a single AES S-box 202. Key 201 represents the actual 8-bit partial secret key that adversaries attempt to reveal, and VSS 203 is the point where electric current is measured. Adversaries observe Out 204 and VSS 203 as many times as possible. By collecting a number of data, DPA can statistically find the correlation between Key 201 and VSS 203 (even if VSS 203 is noisy data). Adversaries group the observed VSS 203 into either $G_0$ or $G_1$ referring to a selection function D, according to equation (1):

$$D=S_{box}^{-1}(c XOR k_{est.}), \quad (1)$$

where c is an 8-bit cipher text, $k_{est.}$ is an estimated 8-bit sub secret key, and $S_{box}^{-1}$ is an inverse AES S-Box function. Moreover, c is an element of CipherText 103 and equivalent to Out 204. The returned D value equals to In 205 if and only if $k_{est.}$=Key 201.

Let $A_0$ and $A_1$ be the average VSS current in $G_0$ and $G_1$.

$$0 \leq t < \text{clock period} \quad (2)$$

$$A_0(t)=1/|G_0|\Sigma_{D(c,kest) \in G0} p_c(t) \quad (3)$$

$$A_1(t)=1/|G_1|\Sigma_{D(c,kest) \in G1} p_{c(t)}, \quad (4)$$

where t is the time VSS current is sampled. $p_c(t)$ is the measured VSS current with respect to cipher text c at time t. Every $p_c(t)$ has to belong to either $G_0$ or $G_1$. $|G_0|$ and $|G_1|$ are the number of $p_c(t)$ in the group.

There are two well-known grouping methods for making $G_0$ or $G_1$. One refers to the ith bit of the 8-bit D value. In this method, $p_c(t)$ is grouped into:

$$G_0 \text{ when } D[i]=0 \text{ and } G_1 \text{ when } D[i]=1. \quad (5)$$

The other grouping refers to Hamming weight of the D. In this method, $p_c(t)$ is grouped into:

$G_0$ when $0 \leq$ Hamming weight of $D<4$ and $$G_1 \text{ when } 4< \text{Hamming weight of } D \leq 8 \quad (6)$$

When $k_{est.} \neq$ Key 201, the absolute difference between $A_1$ and $A_0$ is expected to be close to zero. In contrast, when $k_{est.}$=Key 201, the absolute differential power between $A_0$ and $A_1$ is expected to become largest amongst all $2^8$=256 candidates of 8-bit $k_{est.}$. This largest differential power is denoted as DP and formulated as follows:

$$DP=\arg_t \max |A_0(t)-A_1(t)|. \quad (7)$$

Ideal countermeasures have the same differential power (i.e. DP≈0) for all $k_{est.}$ candidates so that adversaries lose the reasoning for $k_{est.}$=Key 201.

DPA is much faster than brute-force attacks. The DPA search space is $2^8 \times 16$ (128-bit AES uses 16 S-Boxes) whereas there are $2^{128}$ possible candidates of 128-bit ScheduledKey 104. The description that follows focuses on the first order DPA formulated above to compare HDRL to WDDL rather than higher order DPA.

Figure 3:
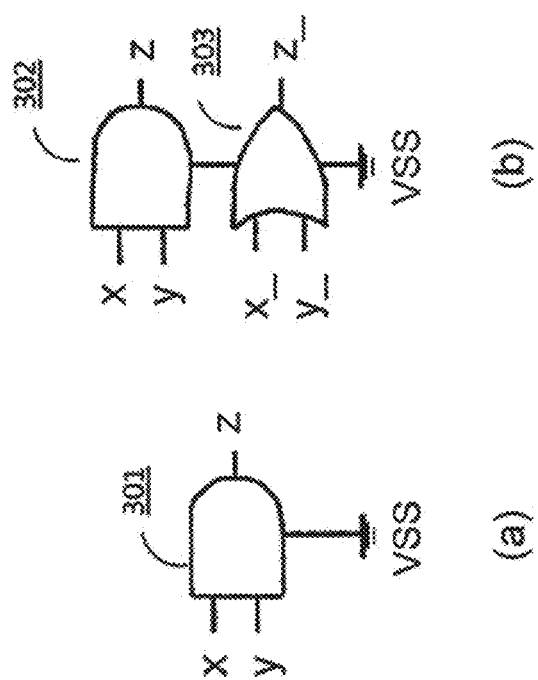
FIG. 3A illustrates an exemplary prior art AND cell (AND2X4).
FIG. 3B illustrates an exemplary prior art WDDL AND cell (AND2X4 and OR2X4).

FIG. 3A illustrates an exemplary AND cell (AND2X4 301). The AND cell 301 has two inputs, x and y, and an output z. The AND cell 301 also has VSS.

FIG. 3B illustrates an exemplary WDDL AND cell (AND2X4 302 and OR2X4 303). The WDDL AND cell has four inputs, x, y, x_, and y_, and two outputs, z, and z_. x_and y_ are complements of x and y, respectively. The WDDL AND cell also has VSS. WDDL couples a complementary cell 303 to every original cell 302 and guarantees at least one of the cells switches every cycle (e.g. AND cells 302 are paired with OR cells 303). However, as also previously mentioned, this approach incurs over 2x area and energy overheads. Nonetheless, WDDL does not suppress DP as is shown in later sections of the present disclosure.

Figure 4:
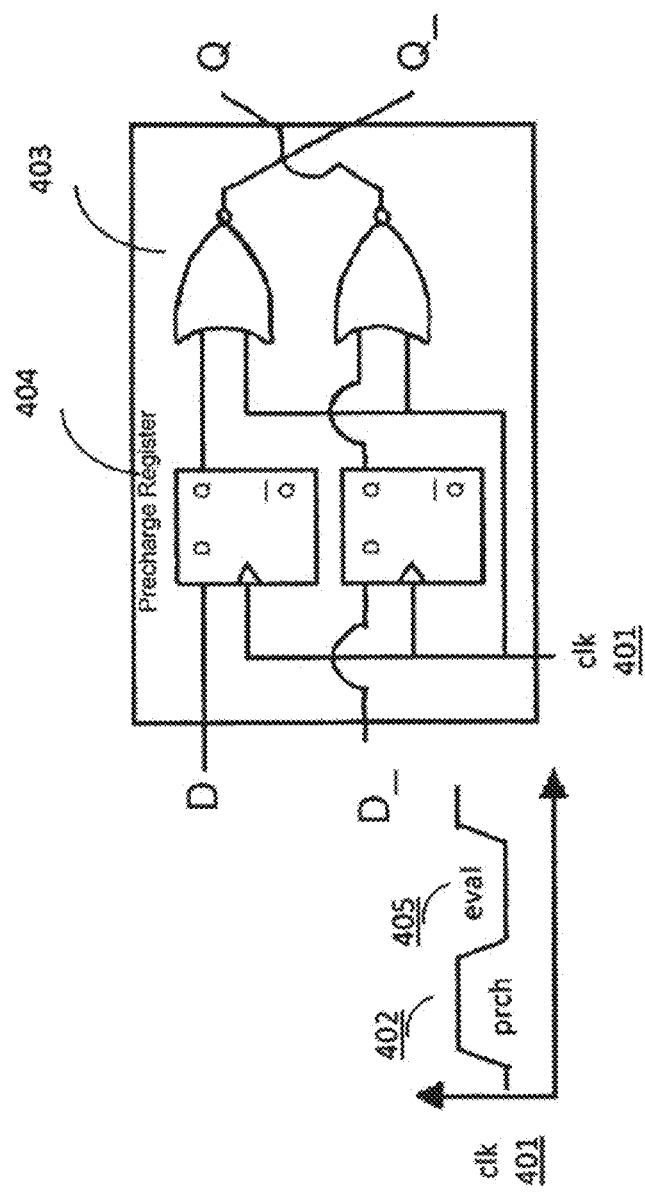
FIG. 4 illustrates exemplary WDDL pre-charge and timing generation.

FIG. 4 illustrates exemplary WDDL pre-charge and timing generation. When clk 401 is 1, the pre-charge wave of 0 402 traverses the combinational circuit 403 connected to the pre-charge register 404. Therefore, all meaningful switchings start from 0, and one of the primary or complementary cells switches at evaluation time 405 when clk 401 is 0. As a result, a 100% switching factor is guaranteed.

Figure 5:
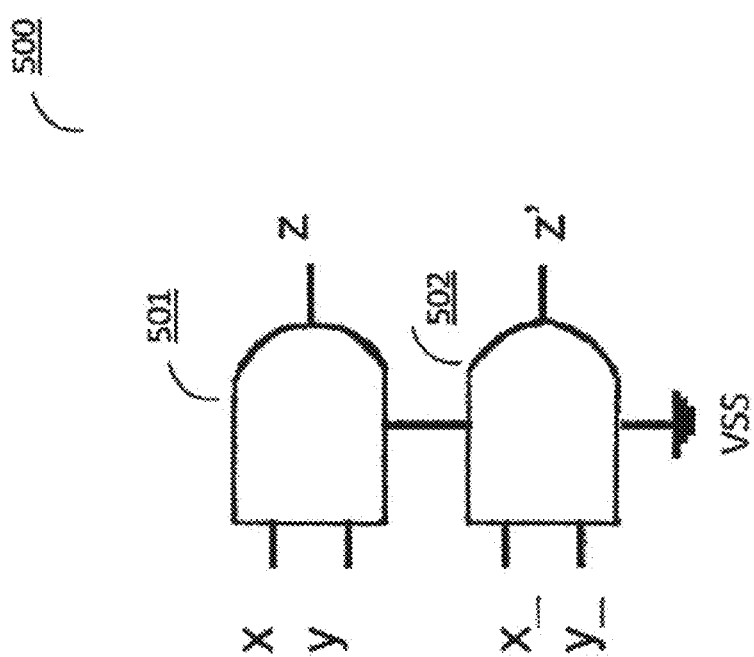
FIG. 5 illustrates an exemplary HDRL AND cell (AND2X4 and AND2X4) for use with the present system, according to one embodiment.

FIG. 5 illustrates an exemplary HDRL AND cell (AND2X4 and AND2X4) for use with the present system, according to one embodiment. The exemplary HDRL AND cell 500 includes a primary AND cell 501 and a complementary AND cell 502, wherein the primary and complementary AND cells 501 and 502 are identical. The HDRL AND cell 500 has VSS, and four inputs (x, y, x_, y_). Note that HDRL does not always have to take negation of primary inputs. Detailed input value conditions to the complementary cells according to various embodiments follows (see Propositions 1-3).

Figure 6:
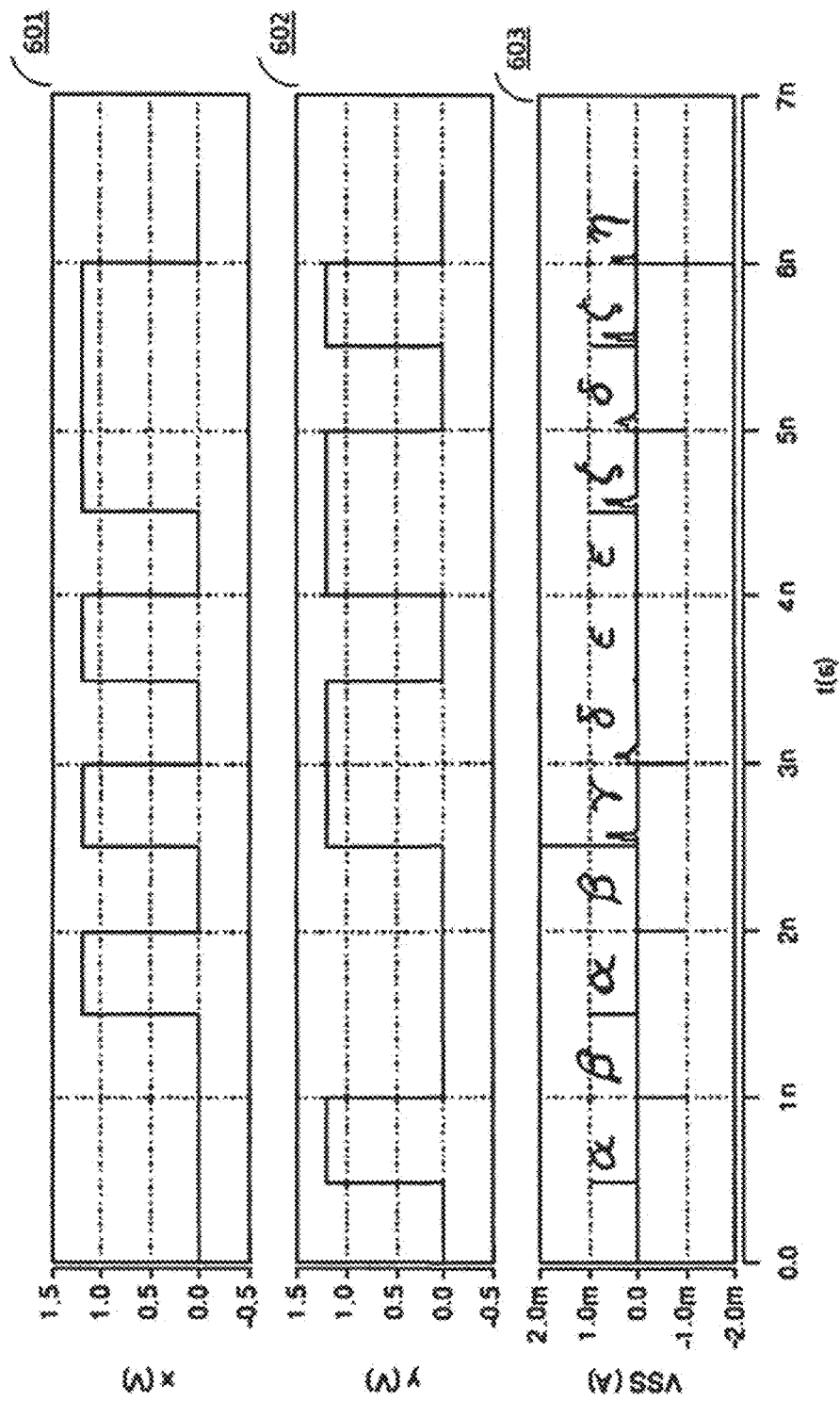
FIG. 6 illustrates an exemplary VSS current curve of an AND cell.

FIG. 6 illustrates an exemplary VSS current curve of an AND cell according to the layout depicted in FIG. 3A. The top two charts are the voltages of x 601 and y 602. The inputs are comprised of all xy switching combinations. The lower chart represents the VSS current 603. FIG. 6 shows that the VSS current flows only when inputs are switching, which is a feature of CMOS. Furthermore, each VSS current shape can be labeled and categorized. For example, there are approximately the same VSS current shapes at 0.5 ns and 1.5 ns, and suppose they are labeled as α. α is defined as the VSS current when either x or y is switching from 0 to 1 (i.e. $\{(x:0\rightarrow 0, y:0\rightarrow 1)$ or $(x:0\rightarrow 1, y:0\rightarrow 0)\}$). Note that the c-load difference of the inputs, x and y, are ignorably small due to the symmetry of the AND cell inputs (equally drive two n- and p-mos transistors). As an example, all of the VSS current waves can be labeled as follows.

$$\alpha \text{ when } \{(x:0\rightarrow 0, y:0\rightarrow 1), (x:0\rightarrow 1, y:0\rightarrow 0)\} \tag{8}$$

$$\beta \text{ when } \{(x:0\rightarrow 0, y:1\rightarrow 0), (x:1\rightarrow 0, y:0\rightarrow 0)\} \tag{9}$$

$$\gamma \text{ when } \{(x:0\rightarrow 1, y:0\rightarrow 1)\} \tag{10}$$

$$\delta \text{ when } \{(x:1\rightarrow 1, y:1\rightarrow 0), (x:1\rightarrow 0, y:1\rightarrow 1)\} \tag{11}$$

$$\epsilon \text{ when } \{(x:0\rightarrow 1, y:1\rightarrow 0), (x:1\rightarrow 0, y:0\rightarrow 1)\} \tag{12}$$

$$\zeta \text{ when } \{(x:1\rightarrow 1, y:0\rightarrow 1), (x:0\rightarrow 1, y:1\rightarrow 1)\} \tag{13}$$

$$\eta \text{ when } \{(x:1\rightarrow 0, y:1\rightarrow 0)\} \tag{14}$$

Based on equations (3) and (4) above, the DP curve of the AND cell is calculated as follows (grouping $(x:0,1\rightarrow 0)$ and $(x:0,1\rightarrow 1)$ VSS current waves into $G_0$ and $G_1$, respectively).

$$A_{x=0} = 1/6(\alpha + \beta + \beta + \delta + \epsilon + \eta) \tag{15}$$

$$A_{x=1} = 1/6(\alpha + \gamma + \epsilon + \zeta + \delta + \zeta) \tag{16}$$

$$DP = |A_{x=0} - A_{x=1}| \tag{17}$$
$$= 1/6|(2\beta + \eta) - (\gamma + 2\zeta)| \neq 0$$

As shown by equation (17), the DP is not equal to zero. This is also true even if the grouping is changed to reflect a grouping by y rather than x.

Figure 7:
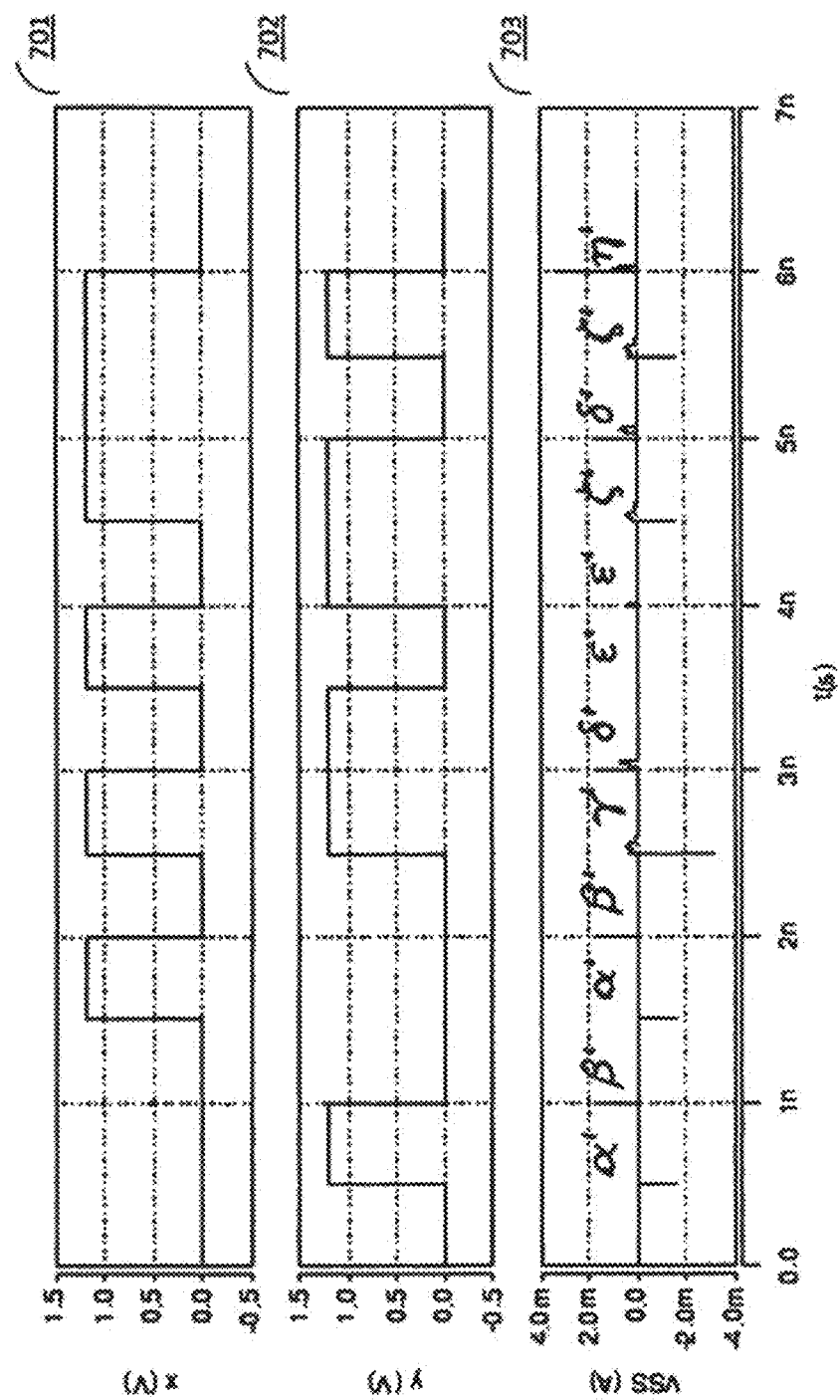
FIG. 7 illustrates an exemplary VSS current curve of an OR cell.

FIG. 7 illustrates an exemplary VSS current curve of an OR cell found in the exemplary WDDL AND cell of FIG. 3B. Included are charts for x 701, y 702, and VSS 703. The input vector and labeling method is the same as equations (8)-(14); however all the current labels include a "complement mark" and $\alpha \neq \alpha'$.

Figure 8:
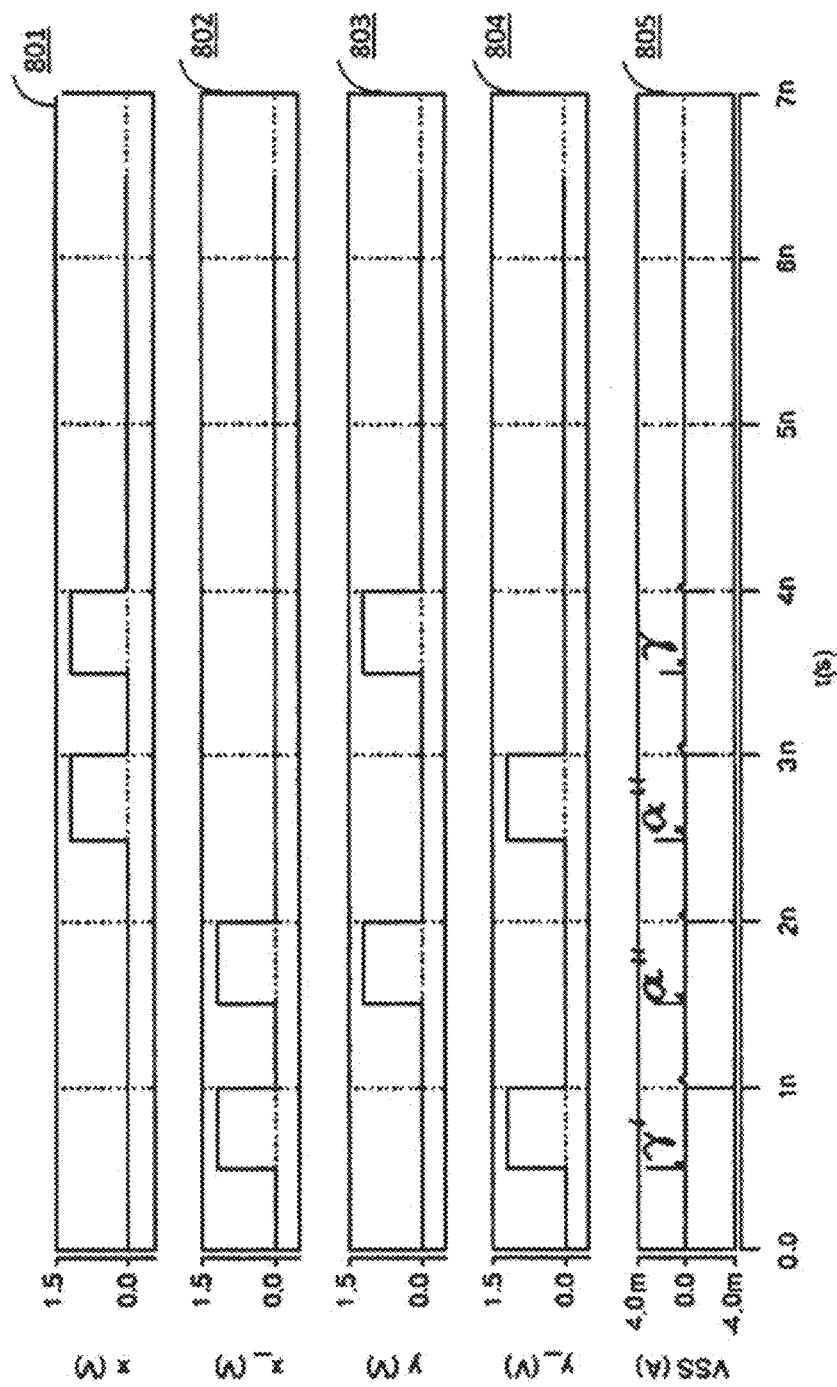
FIG. 8 illustrates an exemplary VSS current curve of a WDDL AND cell.

FIG. 8 illustrates an exemplary VSS current curve of a WDDL AND cell as depicted in FIG. 3B. The top four charts are the voltages of x 801, x_802, y 803, and y_804. The bottom chart represents the VSS current 805. Because WDDL requires all input vectors to be 0 at the pre-charge step, the transitions of x, x_, y, and y_start always from 0. Hence, there are only four cases of input switching combinations:

$$\{(x:0\rightarrow 0, x\_:0\rightarrow 1, y:0\rightarrow 0, y\_:0\rightarrow 1)\} \tag{18}$$

$$\{(x:0\rightarrow 0, x\_:0\rightarrow 1, y:0\rightarrow 1, y\_:0\rightarrow 0)\} \tag{19}$$

$$\{(x:0\rightarrow 1, x\_:0\rightarrow 0, y:0\rightarrow 0, y\_:0\rightarrow 1)\} \tag{20}$$

$$\{(x:0\rightarrow 1, x\_:0\rightarrow 0, y:0\rightarrow 1, y\_:0\rightarrow 0)\} \tag{21}$$

All the VSS current waves are defined as combinations of AND cell labels and OR cell labels. The VSS current waves of equations (18)-(21) correspond to the following four equations.

$$\gamma' = 0 + \gamma' \tag{22}$$

$$\alpha'' = \alpha + \alpha' \tag{23}$$

$$\alpha'' = \alpha + \alpha' \tag{24}$$

$$\gamma = \gamma + 0 \tag{25}$$

To calculate the DP curve of the WDDL AND:

$$A_{x=0} = 1/2(\alpha'' + \gamma') \tag{26}$$

$$A_{x=1} = 1/2(\alpha'' + \gamma) \tag{27}$$

$$DP = |A_{x=0} - A_{x=1}| \tag{28}$$
$$= 1/2|\gamma' - \gamma| \neq 0$$

As shown by equation (28), the DP of the WDDL is not equal to zero either.

Moving on to the complementary cell in the HDRL cell depicted in FIG. 5, since the same cell is used for both primary and complementary cells, it is obvious that:

$$\alpha = \alpha'', \beta = \beta', \gamma = \gamma', \delta = \delta', \epsilon = \epsilon', \zeta = \zeta', \eta = \eta' \tag{29}$$

The equations (29) result in the VSS current waves of the HDRL cell to be defined as combinations of two AND cell labels.

$$\alpha'' = \alpha + \delta' \tag{30}$$

$$\beta'' = \beta + \zeta' \tag{31}$$

$$\gamma'' = \gamma + \eta' \tag{32}$$

$$\delta'' = \delta + \alpha' = \alpha + \delta'\alpha'' \tag{33}$$

$$\epsilon'' = \epsilon + \epsilon' \tag{34}$$

$$\zeta'' = \zeta + \beta' = \beta + \zeta' = \beta 0'' \tag{35}$$

$$\eta'' = \eta + \gamma' = \gamma + \eta' = \gamma'' \tag{36}$$

Figure 9:
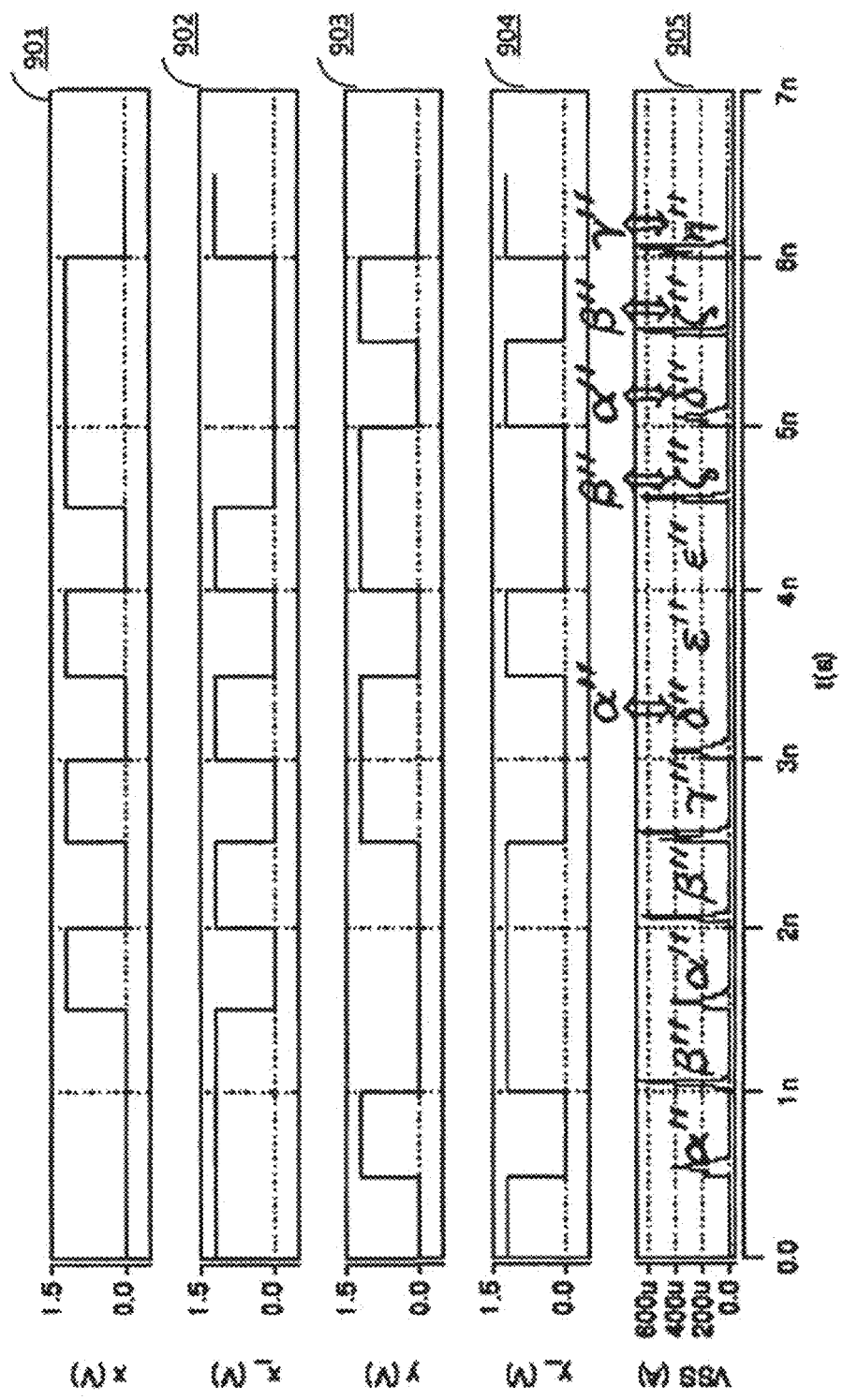
FIG. 9 illustrates an exemplary VSS current curve of an HDRL AND cell, according to one embodiment.

FIG. 9 illustrates an exemplary VSS current curve of an HDRL AND cell, according to one embodiment. The top four charts illustrate the voltages of x 901, x_902, y 903, and y_904. The lower chart represents the VSS current 905. As shown in FIG. 9 and by equations (33), (35), and (36), δ", ζ", and $\eta''$ are interchangeable with $\alpha''$, $\beta''$, and $\gamma''$, respectively. Accordingly, the DP curve of the HDRL AND cell become theoretically zero as follows.

$$A_{x=0} = 1/6(\alpha'' + \beta'' + \beta'' + \delta'' + \varepsilon'' + \eta'') \quad (37)$$

$$A_{x=1} = 1/6(\alpha'' + \gamma'' + \varepsilon'' + \zeta'' + \delta'' + \zeta'') \quad (38)$$

$$\begin{aligned} DP &= |A_{x=0} - A_{x=1}| \\ &= 1/6 |(2\beta'' + \eta'') - (\gamma'' + 2\zeta'')| \\ &= 1/6 |(2\beta'' + \eta'') - (\eta'' + 2\beta'')| = 0 \end{aligned} \quad (39)$$

The reason that all switchings for HDRL are positive is complementing positive current flows are larger than or equal to negative flows. Additionally, the measurement of VSS current should ideally not flow negative current.

Evenly distributed conditions are assumed between $A_{x=0}$ and $A_{x=1}$. If $A_{x=0}$ and $A_{x=1}$ do not have evenly distributed conditions, the DP becomes false positive/negative sign for all candidates for $k_{est}$. For example, if the number of sample power data for $A_{x=0}$ is too small compared to that of $A_{x=1}$, $A_{x=0}$ could be too imprecise on average or distorted by noise from the environment that affects the quality of DP. Therefore, an evenly distributed condition is, in fact, the best condition for adversaries. Note, as previously mentioned, that the exemplary focus is on the first order DPA (i.e. (x:0→0 and x:1→0 are treated as x:0, and are indistinguishable).

Adversaries may intentionally set inputs that cause undistributed conditions between $A_{x=0}$ and $A_{x=1}$ and use the intermediate power shape for more simple attacks such as SPA (simple power analysis). In this case, the power shapes of both WDDL and HDRL are dependent on inputs. For example, WDDL consumes $\gamma'$ for (x:0→0 and y:0→0), and $\gamma$ for (x:0→1 and y:0→1). There is no guarantee that these two inputs produce the same power shape.

Table I shows experimental tools used to validate the approach described herein.

TABLE I

EXPERIMENTAL TOOLS

| | |
|---|---|
| Current Measurement Tool | Synopsys NanoSim C-2009.06 |
| Plotting Tool | Synopsys CosmosScope C-2009.06-SP1 |
| Standard Cell Library | Synopsys SAED_EDK 90 nm |

Figure 10:
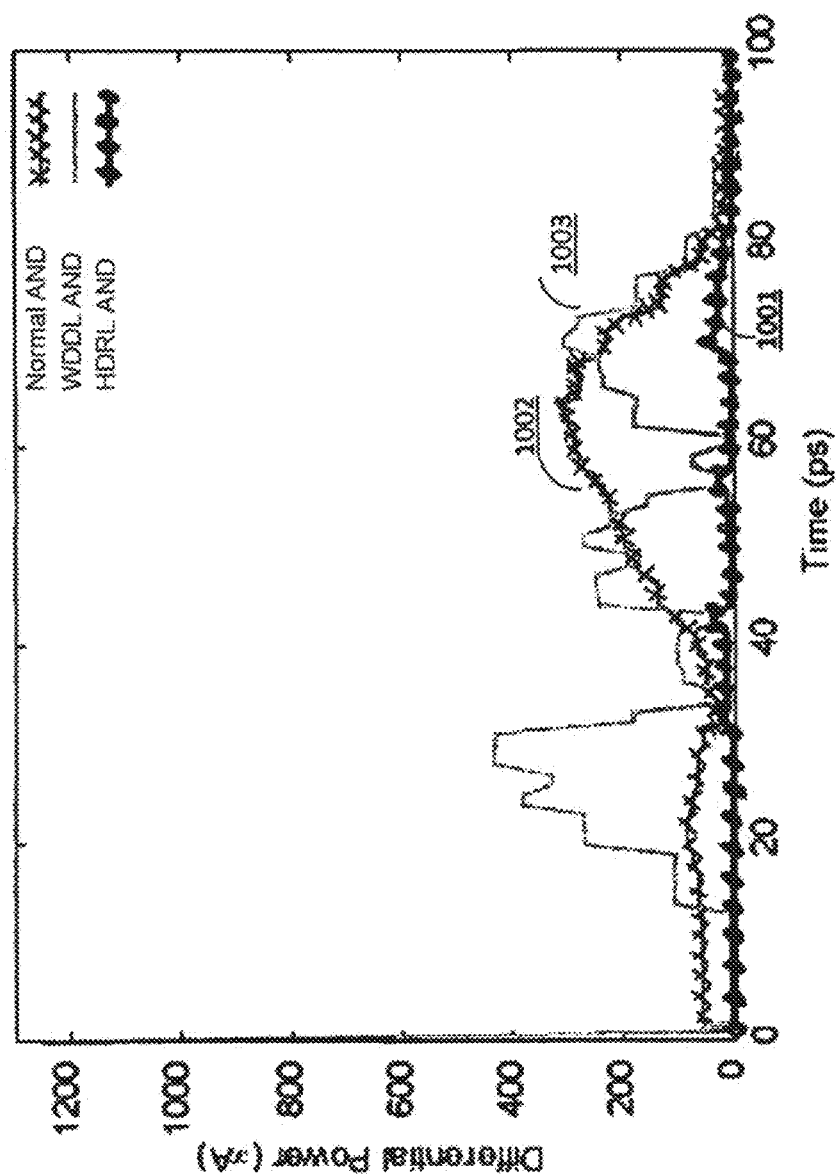
FIG. 10 illustrates an exemplary comparison of power differential curves between an AND cell, a WDDL AND cell, and an HDRL AND cell according to an embodiment of the present system.

FIG. 10 illustrates an exemplary comparison of power differential curves between an AND cell, a WDDL AND cell, and an HDRL AND cell. FIG. 10 is the simulation result of equations (17), (28), and (39). HDRL AND cell (equation (39)) 1001 is virtually flat zero (not exactly zero due to the slight c-load difference between x and y), whereas both AND 1002 and WDDL AND 1003 cells (equations (17) and (28)) are far from the horizontal axis. The peak of AND 1002 is 1248 µA as opposed to that of the WDDL AND 1003 which is 637 µA. The peak of WDDL AND 1003 and AND 1002 is at time 0 in FIG. 10, the peak of the WDDL AND 1003 is smaller than that of the AND 1002.

As can be seen from FIG. 10, the exemplary HDRL AND cell 1001 suppresses DP better than WDDL 1003. WDDL works well only on the assumption that the primary and complementary cells have an equal amount of VSS current flowing through them, which is not true with most standard library cells. The present HDRL technique and exemplary AND cell overcome this problem and, in fact, require a smaller amount of energy overhead.

The zero DP means that the input vectors are independent from the DP of the circuit. In contrast, the non-zero DP means there is a dependency between the input and power consumption. In the latter case, DPA theoretically can find the dependency of input data on power consumption eventually with adequate power sampling data.

In fact, there are slight dependencies between input vectors and the DP for wrong $k_{est}$, but DPA considers these small dependencies to be zero (because the DP for the correct Key 201 becomes notably high without countermeasures). HDRL does not guarantee that the DP is zero for the wrong $k_{est}$ keys. HDRL guarantees the zero DP only for the correct Key 201. Therefore, there may be small dependencies between the input and power consumption for wrong $k_{est}$ keys.

Besides, in crypto-hardware, the surrounding circuit (e.g. there are >=16 S-Boxes in AES) consumes power at the same time. Even though the real inputs become independent from the DP (zero DP) with the present HDRL technique, the surrounding power consumption makes the FALSE DP.

From the adversaries' point of view, they cannot tell whether it is the real DP (input dependent) or false DP (input independent but appears dependent) from the amount of the DP. The purpose of having zero DP consumption is to delete the dependency of inputs on power consumption, not for changing the key ranks even though the rank of correct Key 201 becomes lower as a corresponding result. The present HDRL technique achieves making DP independent from the inputs, in contrast to WDDL where the dependency still exists.

Beyond the exemplary HDRL AND cell implementation shown herein, the present HDRL technique guarantees fully balanced power consumption for an arbitrary combinational circuit. The following Propositions 1-3 guarantee that one can simply duplicate an original circuit so as to make a complementary circuit of HDRL.

Proposition 1:

The sufficient conditions that w' is the input of the corresponding complementary cell to a primary cell with an input w are that Pr(w=1)=Pr(w'=1), where Pr stands for probability, and w and w' have neither concurrent {(w:0→1, w':0→1) nor (w:1→0, w':1→0)} switches.

Proof:

Suppose an HDRL AND such as in FIG. 4 whose inputs satisfy Proposition 1 but DP≠0. This supposition contradicts equation (39). Thus, Proposition 1 is true.

Note negations of primary circuit inputs satisfy Proposition 1. Table II shows the truth table of w and w' that covers all possible combinations of switching for HDRL. In Table II, w' is a negation of w. Since w and w' are Pr(w=1)=Pr(w'=1) and neither have concurrent {(w:0→1, w':0→1) nor (w:1→0, w':1→0)} switches, w and w' satisfy Proposition 1. Negations of primary circuit inputs are easily generated. HDRL complementary circuit inputs do not have to be negations of primary circuit inputs, but have to satisfy Proposition 1.

TABLE II

TRUTH TABLE OF W AND W'

| W | | | W' | | |
|---|---|---|---|---|---|
| 0 | → | 0 | 1 | → | 1 |
| 0 | → | 1 | 1 | → | 0 |
| 1 | → | 0 | 0 | → | 1 |
| 1 | → | 1 | 0 | → | 0 |

Proposition 2:

The primary and complementary outputs from a HDRL cell satisfy Proposition 1 if the inputs of the HDRL cell also satisfy Proposition 1.

Proof:

AND, OR, and NOT cells satisfy Proposition 2 by definition. Thus, Proposition 2 is true for all logic cells.

Table III shows the truth table of HDRL AND, OR, and NOT cells. {x' y'} are the negations of {x y}. Thus, the combinations of {x y} and [x' y'} satisfy Proposition 1. Indeed, Table III shows that the output combinations of {AND(x,y) OR(x,y) NOT(x)} and {AND(x',y') OR(x',y') NOT(x')} also satisfy Proposition 1. Thus, the descendants of HDRL cells also become HDRL cells. Even though a negation of primary inputs is fed into the complementary cells, the outputs from the complementary cells are not negation of primary inputs, but descendant cells still work as HDRL.

as both the original and complementary circuit have the same glitch characteristics (this should be true since the complementary circuit is the duplication of the original circuit in HDRL). On the contrary, WDDL has different glitch characteristics in the complementary circuit since WDDL uses different cells for the complementary circuit from the original circuit. In HDRL, glitches are complemented in the same manner that regular power signatures are complemented.

Experiments were conducted herein using three target S-Box designs. One is referred to herein as "normal" meaning without countermeasures for DPA attacks. The second is referred to herein as "WDDL" meaning pairing each cell with a different complementary cell. The third is referred to herein as "HDRL" meaning pairing each cell with a same complementary cell according to the present disclosure. The same tool and setup were used as shown in Table I above.

TABLE III

TRUTH TABLE OR HDRL AND, OR, AND NOT CELL

| x | y | AND(x, y) | OR(x, y) | NOT(x) | x' | y' | AND(x', y') | OR(x', y') | NOT(x') |
|---|---|---|---|---|---|---|---|---|---|
| 0→0 | 0→0 | 0→0 | 0→0 | 1→1 | 1→1 | 1→1 | 1→1 | 1→1 | 0→0 |
| 0→0 | 0→1 | 0→0 | 0→1 | 1→1 | 1→1 | 1→0 | 1→0 | 1→1 | 0→0 |
| 0→0 | 1→0 | 0→0 | 1→0 | 1→1 | 1→1 | 0→1 | 0→1 | 1→1 | 0→0 |
| 0→0 | 1→1 | 0→0 | 1→1 | 1→1 | 1→1 | 0→0 | 0→0 | 1→1 | 0→0 |
| 0→1 | 0→0 | 0→0 | 0→1 | 1→0 | 1→0 | 1→1 | 1→0 | 1→1 | 0→1 |
| 0→1 | 0→1 | 0→1 | 0→1 | 1→0 | 1→0 | 1→0 | 1→0 | 1→0 | 0→1 |
| 0→1 | 1→0 | 0→0 | 1→1 | 1→0 | 1→0 | 0→1 | 0→0 | 1→1 | 0→1 |
| 0→1 | 1→1 | 0→1 | 1→1 | 1→0 | 1→0 | 0→0 | 0→0 | 1→0 | 0→1 |
| 1→0 | 0→0 | 0→0 | 1→0 | 0→1 | 0→1 | 1→1 | 0→1 | 1→1 | 1→0 |
| 1→0 | 0→1 | 0→0 | 1→1 | 0→1 | 0→1 | 1→0 | 0→0 | 1→1 | 1→0 |
| 1→0 | 1→0 | 1→0 | 1→0 | 0→1 | 0→1 | 0→1 | 0→1 | 0→1 | 1→0 |
| 1→0 | 1→1 | 1→0 | 1→1 | 0→1 | 0→1 | 0→0 | 0→0 | 0→1 | 1→0 |
| 1→1 | 0→0 | 0→0 | 1→1 | 0→0 | 0→0 | 1→1 | 0→0 | 1→1 | 1→1 |
| 1→1 | 0→1 | 0→1 | 1→1 | 0→0 | 0→0 | 1→0 | 0→0 | 1→0 | 1→1 |
| 1→1 | 1→0 | 1→0 | 1→1 | 0→0 | 0→0 | 0→1 | 0→0 | 0→1 | 1→1 |
| 1→1 | 1→1 | 1→1 | 1→1 | 0→0 | 0→0 | 0→0 | 0→0 | 0→0 | 1→1 |

Proposition 3:

A chain of cells works as a complementary circuit if the circuit is a duplication of the primary circuit, and if the inputs of the circuits satisfy Proposition 1.

Proof:

Since Propositions 1 and 2 are true, Proposition 3 is true.

Since all combinatorial logic can be converted into logic that comprise only AND, OR, and NOT cells, any combination of those cells becomes a complementary circuit. Therefore, Propositions 1-3 guarantee that one can simply duplicate an original circuit so as to make a complementary circuit.

Figure 11:
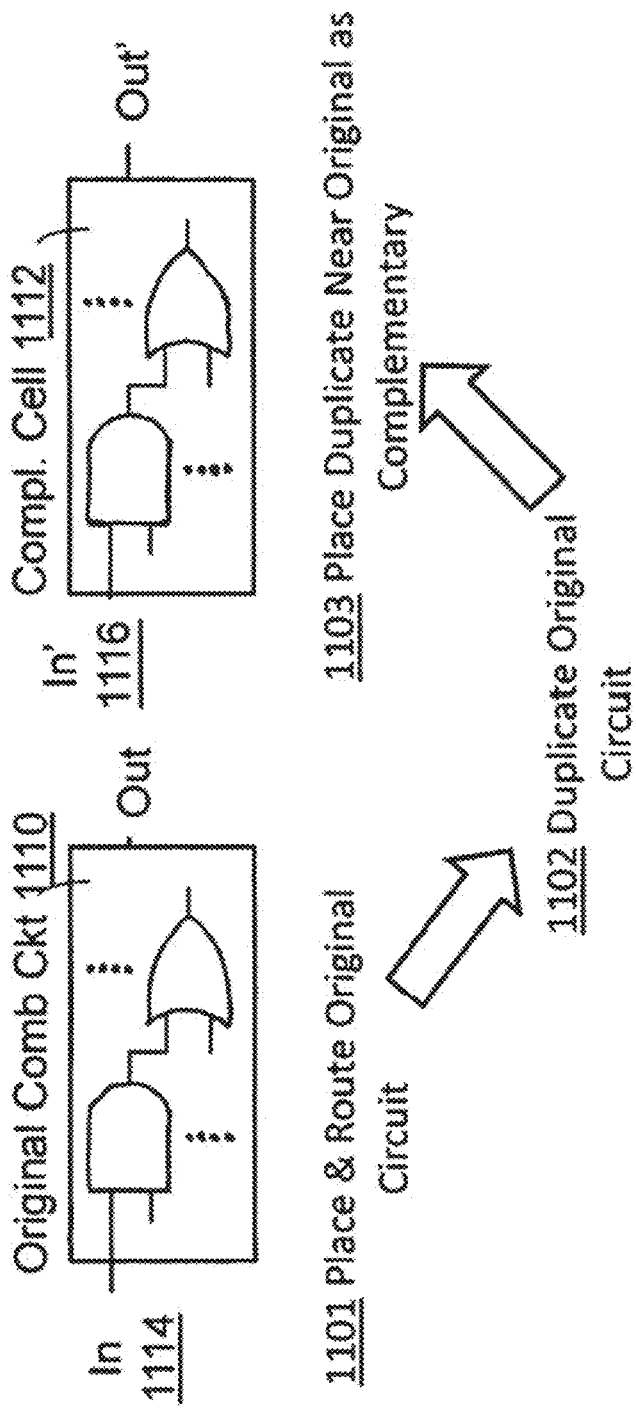
FIG. 11 illustrates an exemplary HDRL design flow for use with the present system, according to one embodiment.

FIG. 11 illustrates an exemplary HDRL design flow for use with the present system, according to one embodiment. In the present HDRL technique, the original circuit can be duplicated, and the duplicated circuit works as complementary cells (by sharing the same VSS, VDD). First, place and route is conducted 1101 with an original circuit 1110. Then the original circuit 1110 is duplicated 1102 to produce a complementary cell 1112 and the complementary cell 1112 placed 1103 next to the original circuit 1110. By feeding negated input 1116 of the input data 1114 to the duplicated circuit 1112 from outside, the duplicated circuit works as a complementary cell. This method also duplicates the wire delay and capacitance to bring better power balancing. Furthermore, complementary cells are isolated from original cells so that there is no delay overhead.

As discussed above, WDDL requires a pre-charge step and HDRL does not. Note that the present HDRL technique is able to complement glitches without a pre-charge step as long The VSS current of all 16 S-Boxes 102 in an AES circuit was measured since CipherText 103 was visible from outside the circuit. 4096 and 16384 VSS current samples were collected to observe how the ranks of the correct Key 201 varied. The inputs were randomly generated 128-bit numbers and injected from PlainText 101 of FIG. 1. Key 201 is fixed at 0x13.

Tables IV and V summarize the ranks of the correct Key 201 amongst all $k_{est}$ for all the groupings with 4096 and 16384 inputs, respectively, for attacking one of the 16 S-Boxes. The higher (smaller) the rank, the larger the DP. The rank of the correct Key 201 hints to adversaries which $k_{est}$ they should attempt. If the rank of the $k_{est}$ is always 1 (or constantly ranked at a particular position), there is a higher chance that the $k_{est}$ is the correct Key 201 by the definition of DPA. Comparison between Tables IV and V show that the ranks of HDRL vary. For example, the rank of the grouping i=1 becomes higher when there are 4096 inputs than 16384 inputs. In contrast, the rank of the grouping i=5 becomes lower. Hence, adversaries are unable to confidently assume that what $k_{est}$ (highly or lowly ranked) is the correct Key 201. The ranks of WDDL with the groupings i=1, 6 are the same even though the number of input changes. In such cases, adversaries have more confidence that they only need to check the highest ranked $k_{est}$ to find the correct Key 201. Accordingly, HDRL is more secure than WDDL.

TABLE IV

RANKS OF CORRECT KEY = 0x13 WITH 4096 INPUTS

| | Eq. (5) | | | | | | | | |
|---|---|---|---|---|---|---|---|---|---|
| | i = 0 | i = 1 | i = 2 | i = 3 | i = 4 | i = 5 | i = 6 | i = 7 | Eq. (6) |
| Normal | 94 | 1 | 120 | 76 | 4 | 16 | 1 | 1 | 1 |
| WDDL | 26 | 1 | 47 | 161 | 15 | 232 | 1 | 112 | 3 |
| HDRL | 141 | 9 | 148 | 213 | 232 | 230 | 109 | 165 | 158 |

TABLE V

RANKS OF CORRECT KEY = 0x13 WITH 16384 INPUTS

| | Eq. (5) | | | | | | | | |
|---|---|---|---|---|---|---|---|---|---|
| | i = 0 | i = 1 | i = 2 | i = 3 | i = 4 | i = 5 | i = 6 | i = 7 | Eq. (6) |
| Normal | 15 | 1 | 1 | 1 | 1 | 1 | 1 | 1 | 1 |
| WDDL | 1 | 1 | 103 | 129 | 6 | 218 | 1 | 256 | 2 |
| HDRL | 208 | 114 | 237 | 145 | 170 | 13 | 205 | 185 | 172 |

Another experiment was conducted for the correct Key 201 fixed at 0x7F in order to show that HDRL functions well for another key. Tables VI and VII show the ranks of the correct Key 201, and the ranks of the correct HDRL Key are more divergent than that of WDDL (the correct key of i=0 in both 4096 and 16384 cases for WDDL is ranked 1). Thus, the security advantage of HDRL is still the same for the different key.

TABLE VI

RANKS OF CORRECT KEY = 0x7F WITH 4096 INPUTS

| | Eq. (5) | | | | | | | | |
|---|---|---|---|---|---|---|---|---|---|
| | i = 0 | i = 1 | i = 2 | i = 3 | i = 4 | i = 5 | i = 6 | i = 7 | Eq. (6) |
| Normal | 46 | 1 | 24 | 96 | 11 | 13 | 67 | 1 | 1 |
| WDDL | 1 | 128 | 214 | 250 | 5 | 172 | 108 | 180 | 142 |
| HDRL | 254 | 15 | 84 | 14 | 252 | 104 | 190 | 49 | 25 |

TABLE VII

RANKS OF CORRECT KEY = 0x7F WITH 16384 INPUTS

| | Eq. (5) | | | | | | | | |
|---|---|---|---|---|---|---|---|---|---|
| | i = 0 | i = 1 | i = 2 | i = 3 | i = 4 | i = 5 | i = 6 | i = 7 | Eq. (6) |
| Normal | 1 | 1 | 1 | 1 | 1 | 1 | 1 | 1 | 1 |
| WDDL | 1 | 1 | 25 | 243 | 4 | 209 | 66 | 122 | 4 |
| HDRL | 199 | 85 | 89 | 73 | 255 | 252 | 112 | 232 | 224 |

Table VIII illustrates the comparison in area and energy consumption, and shows that HDRL can be implemented incurring significantly smaller energy overhead than WDDL. The power overhead of the WDDL complementary cells alone is 65.85% (not 100%) since the complementary cells are not switching while the primary cells are switching. However, since WDDL requires the pre-charge steps causing twice switching frequency, the total energy overhead becomes 165.85×2−100−231.7%.

TABLE VIII

COMPARISON IN AREA AND ENERGY CONSUMPTION

| | Area | Energy |
|---|---|---|
| Normal | 100.0% | 100.0% |
| WDDL | 200.3% | 331.7% |
| HDRL | 200.0% | 200.0% |

*Normalized by the Normal S-Box

Figure 12A:
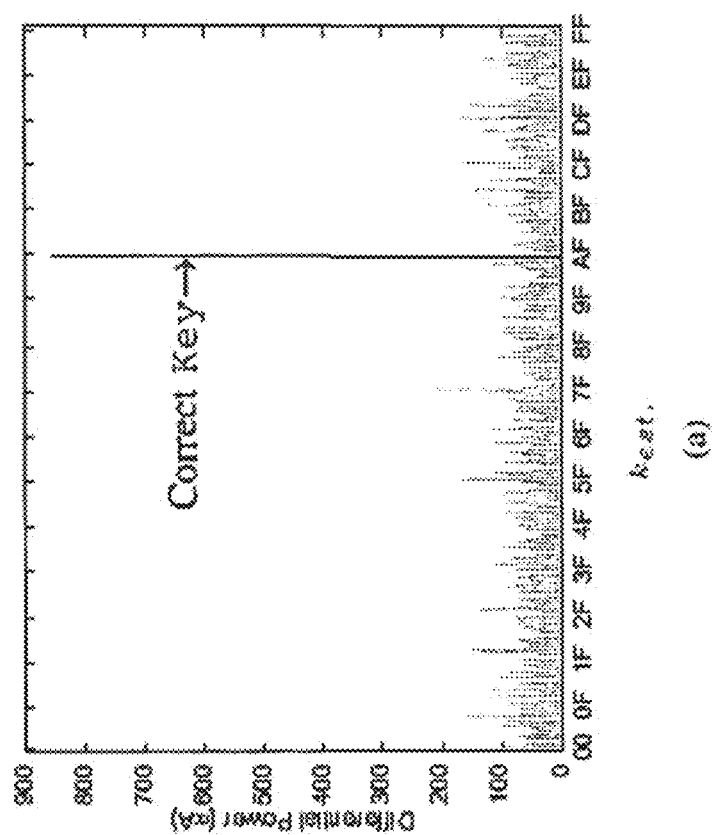
FIGS. 12A-12C illustrate exemplary results of a DPA attack on AES S-boxes with normal design, WDDL design, and HDRL design, according to one embodiment of the present system.
Figure 12B:
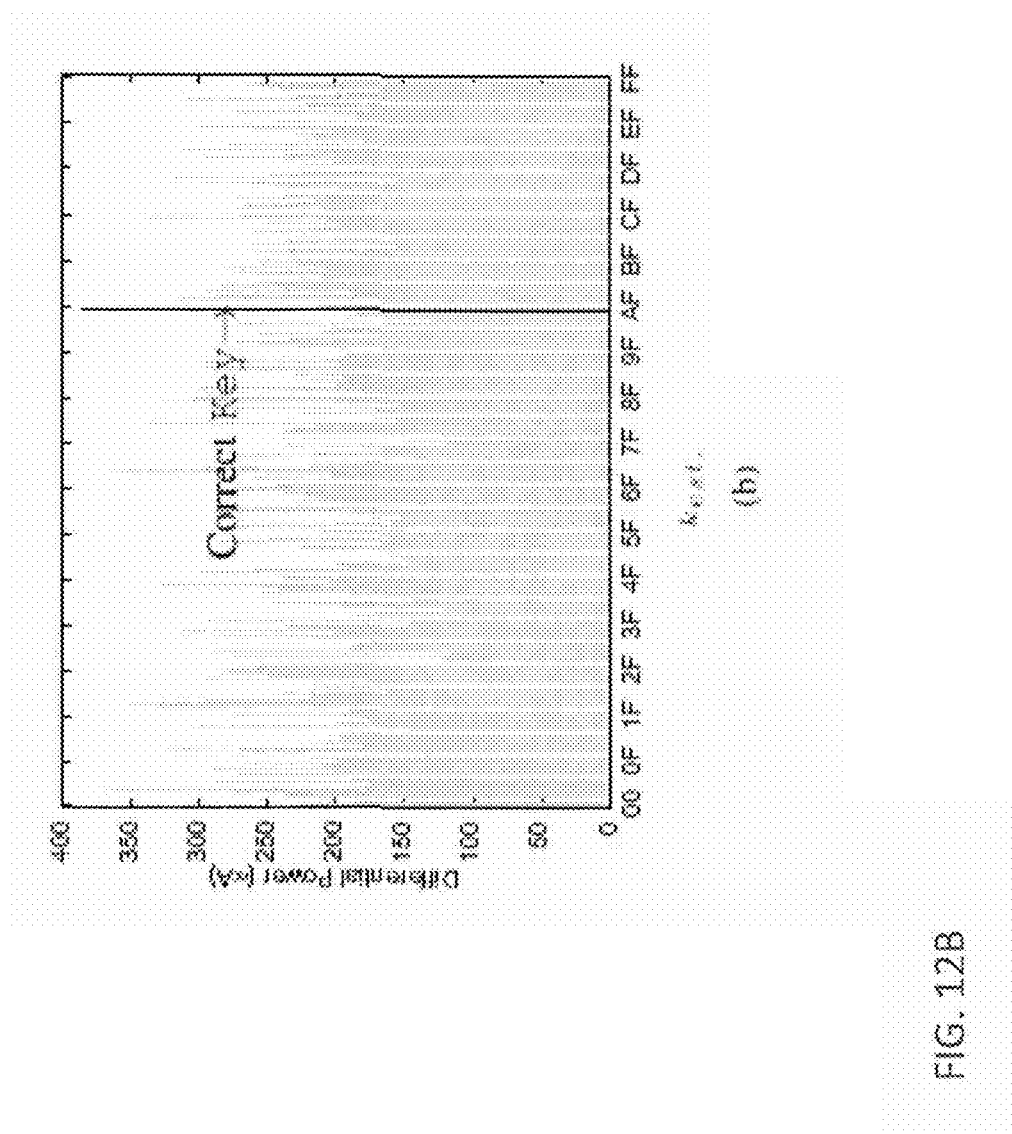
Figure 12C:
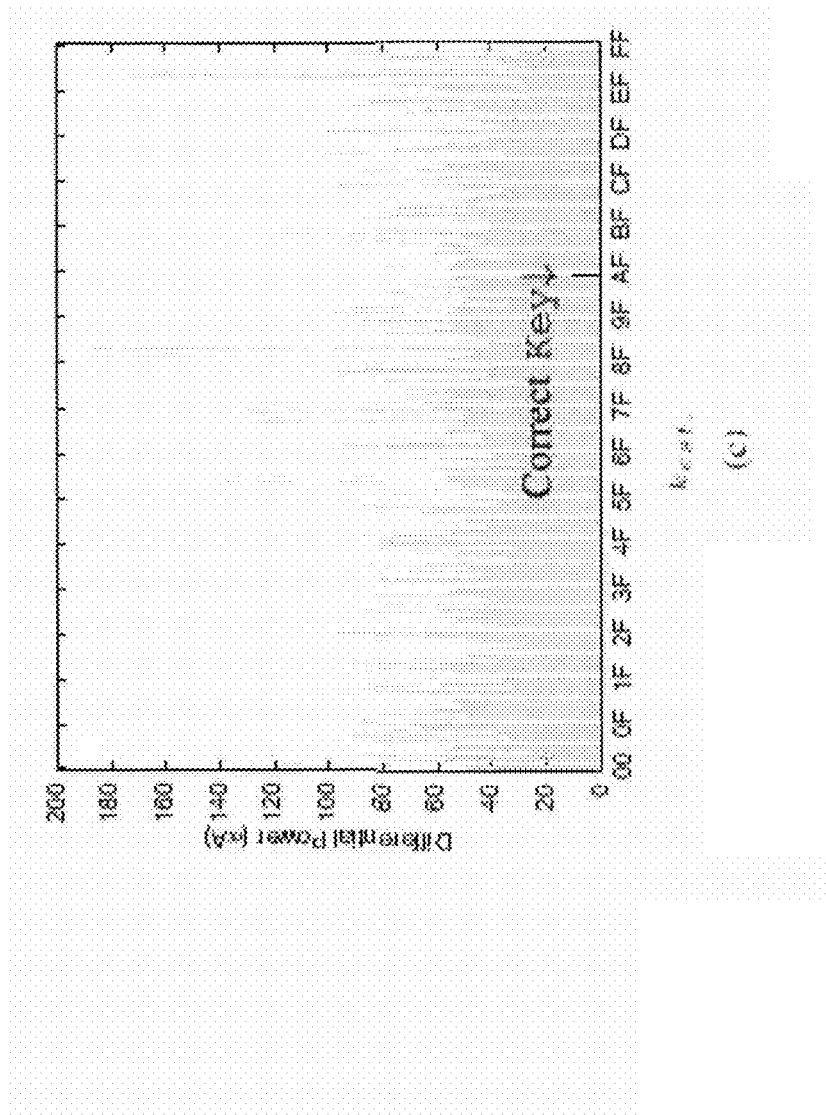

FIGS. 12A-12C illustrate exemplary results of a DPA attack on AES S-boxes with normal design, WDDL design, and HDRL design, according to one embodiment. The horizontal axes represent the 8-bit estimated secret keys ($k_{est}$), and the vertical axes are the differential power (DP). In FIG. 12A, the normal S-Box shows a sharp peak when Key=$k_{est}$. In FIG. 12B, the WDDL shows that the $1^{st}$ peak of $k_{est}$ is smaller, but it is still equal to Key. The rank of the correct Key gives adversaries an order of $k_{est}$ they should attempt. Therefore, the larger the number of the rank, the higher the DPA attack resistivity. FIG. 12C shows that, using HDRL, the $256^{th}$ peak of $k_{est}$ is equal to Key, which demonstrates that HDRL has higher DPA attack resistivity than WDDL for this grouping.

While the invention is susceptible to various modifications, and alternative forms, specific examples thereof have been shown in the drawings and are herein described in detail. It should be understood, however, that the invention is not to be limited to the particular forms or methods disclosed, but to the contrary, the invention is to cover all modifications, equivalents and alternatives falling within the spirit and scope of the appended claims.

In the description above, for purposes of explanation only, specific nomenclature is set forth to provide a thorough understanding of the present disclosure. However, it will be apparent to one skilled in the art that these specific details are not required to practice the teachings of the present disclosure.

The various features of the representative examples and the dependent claims may be combined in ways that are not specifically and explicitly enumerated in order to provide additional useful embodiments of the present teachings. It is also expressly noted that all value ranges or indications of groups of entities disclose every possible intermediate value or intermediate entity for the purpose of original disclosure, as well as for the purpose of restricting the claimed subject matter.

Homogenous dual-rail logic for DPA attack resistive circuit design has been disclosed. It is understood that the embodiments described herein are for the purpose of elucidation and should not be considered limiting the subject matter of the disclosure. Various modifications, uses, substitutions, combinations, improvements, methods of productions without departing from the scope or spirit of the present invention would be evident to a person skilled in the art.

What is claimed is:

1. A method, comprising:
    inputting a first set of inputs to an individual one of one or more primary cells of an HDRL circuit, the HDRL circuit comprising one or more primary cells and a complementary cell positioned adjacent to the individual one of the one or more primary cells, wherein the complementary cell is a duplicate of the individual one of the one or more primary cells; and
    inputting a second set of inputs to the complementary cell, wherein the second set of inputs includes an exact negation of the first set of inputs;

wherein the HDRL circuit includes functionality that is the same as a functionality of the individual one of the one or more primary cells.

2. The method of claim 1, wherein the HDRL circuit has a differential power at a level that is resistive to DPA attacks.

3. The method of claim 2, wherein the differential power is a power consumption of the HDRL circuit.

4. The method of claim 1, wherein the complementary cell and primary cell share the same VSS and VDD.

5. The method of claim 1, wherein the HDRL circuit is includable into a cryptographic module that implements an algorithm selected from the group consisting of AES, Blowfish, DES, Triple DES, Serpent, Twofish, Camellia, CAST-128, IDEA, RC2, RC5, SEED, Skipjack, TEA, and XTEA.

6. The method of claim 1, wherein the primary cell is selected from the group consisting of an AND cell, an OR cell, an XOR cell, an XNOR cell, and a NOT cell.

7. The method of claim 1, wherein the primary cell is any standard cell.

8. An HDRL circuit, comprising:
   a primary cell;
   a complementary cell, wherein the complementary cell is a duplicate of the primary cell;
   a first set of inputs; and
   a second set of inputs, wherein the second set of inputs includes an exact negation of the first set of inputs;
   wherein the HDRL circuit includes functionality that is the same as a functionality the primary cell.

9. The HDRL circuit of claim 8 further comprising a differential power at a level that is resistive to DPA attacks.

10. The HDRL circuit of claim 9, wherein the differential power is a power consumption of the HDRL circuit.

11. The HDRL circuit of claim 8, wherein the complementary cell and primary cell share the same VSS and VDD.

12. The HDRL circuit of claim 8, wherein the HDRL circuit is includable into a cryptographic module that implements an algorithm selected from the group consisting of AES, Blowfish, DES, Triple DES, Serpent, Twofish, Camellia, CAST-128, IDEA, RC2, RC5, SEED, Skipjack, TEA, and XTEA.

13. The HDRL circuit of claim 8, wherein the primary cell is selected from the group consisting of an AND cell, an OR cell, an XOR cell, an XNOR cell, and a NOT cell.

14. The HDRL circuit of claim 8, wherein the primary cell is any standard cell.

15. A module, comprising:
   an HDRL circuit implementing a cryptographic algorithm, the HDRL circuit comprising
      a primary cell;
      a complementary cell, wherein the complementary cell is a duplicate of the primary cell;
      a first set of inputs; and
      a second set of input, wherein the second set of inputs includes an exact negation of the first set of inputs;
   wherein the HDRL circuit includes functionality that is the same as a functionality of the primary cell.

16. The module of claim 15, wherein the HDRL circuit further comprises a differential power at a level that is resistive to DPA attacks.

17. The module of claim 16, wherein the differential power is a power consumption of the HDRL circuit.

18. The module of claim 15, wherein the complementary cell and primary cell share the same VSS and VDD.

19. The module of claim 15, wherein the cryptographic algorithm is selected from the group consisting of AES, Blowfish, DES, Triple DES, Serpent, Twofish, Camellia, CAST-128, IDEA, RC2, RC5, SEED, Skipjack, TEA, and XTEA.

20. The module of claim 15, wherein the primary cell is any standard cell.

21. An encryption system, comprising:
   a plurality of modules according to claim 15.

* * * * *